(12) United States Patent
Saruki et al.

(10) Patent No.: US 8,466,676 B2
(45) Date of Patent: Jun. 18, 2013

(54) MAGNETIC SENSOR WITH BRIDGE CIRCUIT INCLUDING MAGNETORESISTANCE EFFECT ELEMENTS

(75) Inventors: Shunji Saruki, Tokyo (JP); Hiraku Hirabayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 230 days.

(21) Appl. No.: 12/836,138

(22) Filed: Jul. 14, 2010

(65) Prior Publication Data

US 2011/0025318 A1 Feb. 3, 2011

(30) Foreign Application Priority Data

Jul. 29, 2009 (JP) ................................ 2009-176448

(51) Int. Cl.
*G01R 33/02* (2006.01)
(52) U.S. Cl.
USPC ........................................................ 324/252
(58) Field of Classification Search
None
See application file for complete search history.

(56) References Cited

U.S. PATENT DOCUMENTS

| | | | |
|---|---|---|---|
| 5,561,368 A | 10/1996 | Dovek et al. | |
| 5,789,919 A * | 8/1998 | Umemoto et al. | 324/207.21 |
| 7,054,114 B2 * | 5/2006 | Jander et al. | 360/324.1 |
| 7,339,769 B2 * | 3/2008 | Carey et al. | 360/324.11 |
| 7,786,725 B2 * | 8/2010 | Furukawa et al. | 324/207.21 |
| 2002/0036497 A1 * | 3/2002 | Inage et al. | 324/252 |
| 2008/0005891 A1 | 1/2008 | Yuasa et al. | |
| 2008/0180860 A1 | 7/2008 | Takahashi et al. | |
| 2010/0079135 A1 | 4/2010 | Ando et al. | |

FOREIGN PATENT DOCUMENTS

| | | |
|---|---|---|
| CN | 101101958 A | 1/2008 |
| CN | 101252037 A | 8/2008 |
| JP | A-63-172918 | 7/1988 |
| JP | A-08-226960 | 9/1996 |
| JP | A-2001-217478 | 8/2001 |
| JP | A-2009-115688 | 5/2009 |
| JP | A-2009-121858 | 6/2009 |
| WO | WO2008/156008 | 12/2008 |

OTHER PUBLICATIONS

Tondra et al ,"Picotesla field sensor design using spin dependent tunneling devices", Jun. 1, 1998, Juornal of Applied physics, vol. 83, No. 11, pp. 6688-6690.*
Moriizumi and Nakamoto, "Electron Telecommunication, and Information curriculum for the 21$^{st}$ Century, Series A-7, Sensor engineering," Shokodo Co., Ltd., Mar. 31, 2004 pp. 112-113 (with translation).
Office Action dated Jul. 11, 2011 issued in Japanese Patent Application No. 2009-176448 (with translation).
Nov. 18, 2010 European Search Report issued in Application No. EP 10 17 0028.
Sep. 7, 2012 Office Action issued in Chinese Patent Application No. CN 201010243163.4 (English Translation only).
English translation of Feb. 4, 2013 Office Action issued in Chinese Application No. 201010243163.4.

* cited by examiner

*Primary Examiner* — Vinh Nguyen
(74) *Attorney, Agent, or Firm* — Oliff & Berridge, PLC

(57) ABSTRACT

A magnetic sensor for detecting a direction of an external magnetic field comprises: a bridge circuit configured to provide an output that changes in accordance with the direction of the external magnetic field, the bridge circuit including four resistance element sections, each of which comprises at least one magnetoresistance effect element; and two resistors connected to respective output terminals of the bridge circuit. The ratio of the resistance of each of the resistors to that of the bridge circuit is at least 2 when the resistance of each of the resistance element sections is at a minimum corresponding to a change in magnetoresistance.

2 Claims, 3 Drawing Sheets

MAGNETIC SENSOR WITH BRIDGE CIRCUIT INCLUDING MAGNETORESISTANCE EFFECT ELEMENTS

BACKGROUND OF THE INVENTION

1. Field of the Invention

The present invention relates to a magnetic sensor, and in particular to a magnetic sensor with a bridge circuit including magnetoresistance effect elements.

2. Description of the Related Art

In recent years, magnetic sensors have been used to detect the rotation angle of a rotator such as a steering wheel in a vehicle.

For example, JP 8-226960 discloses a magnetic sensor with a bridge circuit including magnetoresistance effect elements (MR elements), the bridge circuit being configured to provide an output that changes in accordance with the direction of an external magnetic field. In such a magnetic sensor, a magnet or the like is installed on the rotator, so that the direction of the external magnetic field changes in accordance with rotation of the rotator. The rotation angle of the rotator is detected by detecting the direction of the external magnetic field. Thus, naturally, highly accurate detection of the direction of the external magnetic field is required. For this purpose, much effort has been made to more accurately measure the output voltage from the bridge circuit including MR elements.

For example, JP 2009-115688 discloses a magnetic sensor with a bridge circuit including four MR elements and an amplifying circuit connected to the bridge circuit, the amplifying circuit including a feedback resistor for setting a gain having an opposite temperature characteristic to that of the bridge circuit. In such a magnetic sensor, a change in output voltage due to temperature change is suppressed by the feedback resistor for setting a gain having an opposite temperature characteristic to that of the bridge circuit. Consequently, a change in sensitivity of the magnetic sensor due to temperature change is compensated for, and thus the detection accuracy of the magnetic sensor is improved.

However, the above-described measure fails to take into account a shunt current flowing from the bridge circuit of the magnetic sensor into the external device (amplifying circuit) during measurement of the output voltage. The shunt current causes an electrical unbalance of the bridge circuit, resulting in an error in the measured value of the output voltage itself.

SUMMARY OF THE INVENTION

The present invention relates to a magnetic sensor for detecting the direction of an external magnetic field, the magnetic sensor comprising a bridge circuit including four resistance element sections, each of which includes at least one magnetoresistance effect element. An object of the present invention is to provide a magnetic sensor which can improve the detection accuracy of the external magnetic field by detecting the output voltage more accurately.

According to an embodiment of the present invention, a magnetic sensor for detecting a direction of an external magnetic field comprises: a bridge circuit configured to provide an output that changes in accordance with the direction of the external magnetic field, the bridge circuit including four resistance element sections, each of which comprises at least one magnetoresistance effect element; and two resistors connected to respective output terminals of the bridge circuit. The ratio of the resistance of each of the resistors to that of the bridge circuit is at least 2 when the resistance of each of the resistance element sections is at a minimum corresponding to a change in magnetoresistance.

Such a magnetic sensor enables shunt current that flows into an external device for measuring the output voltage to be reduced. Thus, the present invention can provide a magnetic sensor which can improve the detection accuracy of the external magnetic field by detecting the output voltage more accurately.

The abovementioned or other objects, features and advantages of the present invention will be readily apparent by a description given below by referring to the attached drawings that illustrate the present invention.

DETAILED DESCRIPTION OF THE PREFERRED EMBODIMENTS

An embodiment of the present invention will now be described with reference to the attached drawings.

Figure 1:
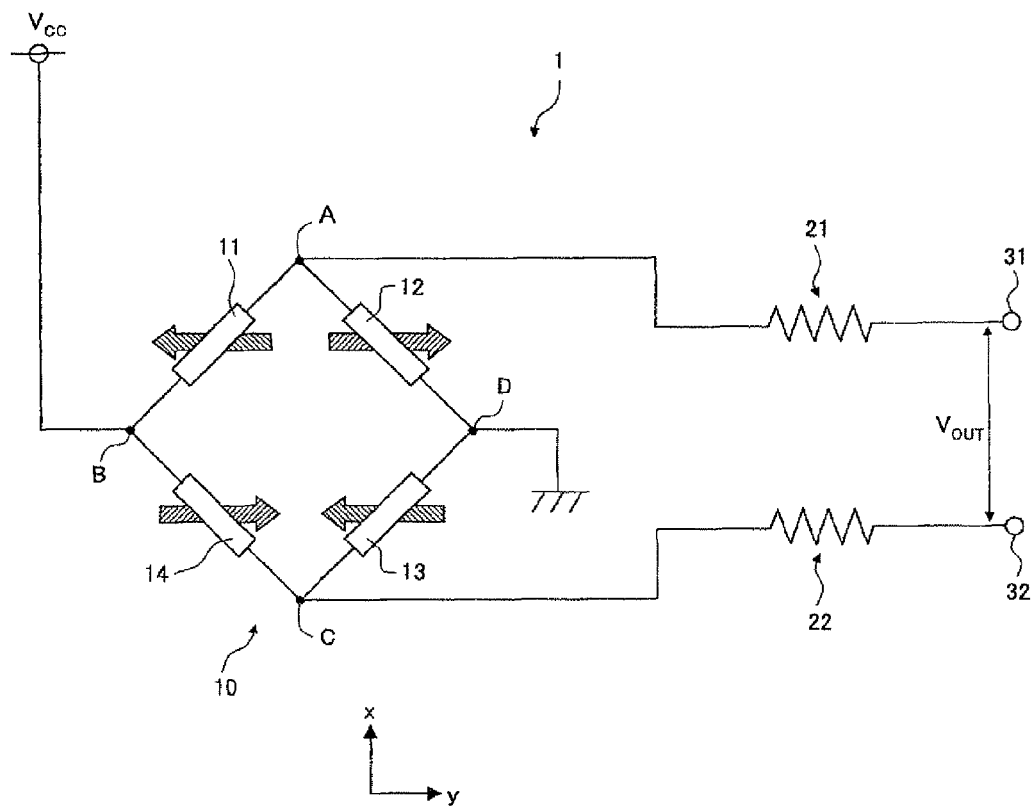
FIG. 1 is a circuit diagram showing the configuration of a magnetic sensor according to an embodiment of the present invention.

FIG. 1 is a circuit diagram showing the configuration of the magnetic sensor of the present embodiment.

Magnetic sensor 1 of the present embodiment comprises bridge circuit 10 including four resistance element sections, each of which includes the same magnetoresistance effect element (MR element) 11-14. Bridge circuit 10 is configured to provide an output that changes in accordance with the direction of an external magnetic field as described below. The output is read out, through external connection terminals 31, 32, by an external device connected to external connection terminals 31, 32.

Bridge circuit 10 includes a parallel circuit, in which a series circuit including first and second MR elements 11, 12 and a series circuit including third and fourth MR elements 13, 14 are connected in parallel with each other. Connection points B, D between the two series circuits each correspond to input terminals of bridge circuit 10. A first input terminal corresponds to connection point D between first MR element 11 and fourth MR element 14, to which a power source or the like is connected and an supply voltage $V_{cc}$ is applied. A second input terminal corresponds to connection point D between second MR element 12 and third MR element 13, which is grounded.

Each of MR elements 11-14 has a typical spin-valve type film configuration. In other words, each of MR elements 11-14 includes a pinned layer whose magnetization direction is fixed with respect to an external magnetic field, a free layer whose magnetization direction changes in accordance with the external magnetic field, and a spacer layer sandwiched between the pinned layer and the free layer. The magnetization direction of the free layer has a relative angle to that of the pinned layer which angle depends on the external magnetic field. In each of MR elements 11-14, the spin-dependent scattering of conductive electrons changes according to the relative angle. This in turn causes a change in magnetoresistance. Furthermore, MR elements 11-14 are arranged such that the plane of bridge circuit 10 defined by four MR elements 11-14 is substantially parallel to the film plane of each of MR elements 11-14.

The magnetization directions of the pinned layers in MR elements 11-14 are such that those of the adjacent MR elements are antiparallel to each other, as shown by shaded arrows in FIG. 1. Thus, the relative angle between the magnetization directions of the pinned layer and the free layer changes between two pairs of MR elements: one including first and forth MR elements 11, 14, the other including second and third MR elements 12, 13. Hence, two pairs of MR elements show different responses to a change in the external magnetic field (different changes in magnetoresistance). This enables magnetic sensor 1 of the present embodiment to detect the external magnetic field as described below.

Each of MR elements 11-14 is preferably a tunnel magnetoresistance effect element (TMR element) that uses a tunnel barrier layer as a spacer layer. In that case, since the bridge circuit includes TMR elements with a high magnetoresistance ratio (MR ratio), a high output voltage can be obtained. Consequently, a magnetic sensor with such a bridge circuit can carry out accurate measurement without the need for an amplifying circuit.

Moreover, magnetic sensor 1 includes two resistors 21, 22 as well as bridge circuit 10, the two resistors being connected to output terminals A, C of bridge circuit 10, respectively. First resistor 21 is connected to the first output terminal, i.e., connection point A between first MR element 11 and second MR element 12, of bridge circuit 10. Second resistor 22 is connected to the second output terminal, i.e., connection point C between third MR element 13 and fourth MR element 14, of bridge circuit 10. The other ends of resistors 21, 22 are connected to external connection terminals 31, 32 for connecting magnetic sensor 1 to an external device such as an operational amplifier (OP) or a voltmeter (VM). Thus, an output voltage from magnetic sensor 1 is determined by measuring potential difference $V_{OUT}$ between external connection terminals 31 and 32.

Each of resistors 21, 22 has a resistance that is at least twice and preferably at least 12 times as large as the resistance of bridge circuit 10, i.e., the parallel circuit including four MR elements 11-14, the resistance of bridge circuit 10 being obtained when the resistance of each of MR elements is at a minimum corresponding to the change in magnetoresistance. Thus, when the output voltage from magnetic sensor 1 is measured through external connection terminals 31, 32, the resulting current can be prevented from being shunted, so that the angle error can be significantly reduced. This will be described below in detail.

Now, the operation of bridge circuit 10 providing an output that changes in accordance with the external magnetic field will be briefly described.

Here, it will be explained how bridge circuit 10 operates when the magnetization direction of the pinned layer in each of MR elements 11-14 is directed along the y direction and when an external magnetic field is applied into the xy plane will be described, as shown by the shaded arrows in FIG. 1.

In an initial state, the external magnetic field is applied in the x direction. In this case, the magnetization direction of the free layer in each of MR elements 11-14 coincides with the direction of the external magnetic field, i.e. the x direction. Thus, in all MR elements 11-14, the magnetization direction of the pinned layer is perpendicular to that in the free layer. As a result, each of MR elements 11-14 has the same resistance, and thus the potential difference between output terminals A and C of bridge circuit 10 (the output voltage from bridge circuit 10) is zero.

Next, when the external magnetic field is tilted from the x direction, the relative angle between the magnetization directions of the pinned layer and the free layer changes among MR elements 11-14. Thus, MR elements 11-14 have different resistance. For example, when the external magnetic field is rotated counterclockwise in the figure, the magnetization direction of the free layer in first and third MR elements 11, 13 changes so as to be parallel to that of the pinned layer. Thus, the resistance of each of MR elements 11, 13 decreases from its initial value. On the other hand, in each of second and fourth MR elements 12, 14, since the magnetization directions change so as to be antiparallel to each other, the resistance increases. As a result, a finite output voltage appears between output terminals A and C of bridge circuit 10. The output voltage is maximized when the direction of the external magnetic field coincides with the −y direction, and returns to zero when the direction coincides with the −x direction. The resulting output voltage approximates a sine wave with respect to the direction (rotation angle) of the external magnetic field. This allows the direction (rotation angle) of the external magnetic field to be determined based on an output waveform with respect to the direction of the external magnetic field.

In the actual detection of the rotation angle, another magnetic sensor configured to output, for example, a cosine waveform is used in addition to magnetic sensor 1 in FIG. 1. Then, based on output waveforms from these two sensors, the direction of the external magnetic field is accurately determined. A similar result can be obtained by, for example, adding a magnetic sensor with the same configuration as magnetic sensor 1, in which the pinned directions coincide with the x direction.

As described above, for the measurement of the output voltage from bridge circuit 10, output terminals A, C thereof need to be connected to an external device, such as the OP or the VM, through external connection terminals 31, 32. It is thus difficult to avoid a very small current flowing from bridge circuit 10 to the external device. Hence, in bridge circuit 10 in FIG. 1, a current flowing through second and third MR elements 12, 13 is smaller than that flowing through first and fourth MR elements 11, 14 due to the shunt current. This may cause the bridge circuit to become electrically unbalanced, distorting the sine wave, which is the ideal output waveform. The distortion may cause an error in the angle, i.e., the direction of the external magnetic field, determined based on the output waveform.

The present inventors have found that the angle error resulting from the shunt current flowing through the external device can be significantly reduced under a certain condition. The condition is that each of the output terminals of the bridge circuit connects to a resistor having a resistance that is at least twice and preferably at least 12 times as large as that of the bridge circuit. The resistance of the bridge circuit in this case is obtained when the resistance of each of the MR elements included in the bridge circuit is at a minimum corresponding to the change in magnetoresistance, i.e., when the magnetization directions of the pinned layer and the free layer in each MR element are parallel to each other. Such resistance is hereinafter referred to as the minimum resistance of the bridge circuit. This is a feature of the present invention. This feature will be described below with reference to FIGS. 2 and 3 that show calculation results.

Figure 2:
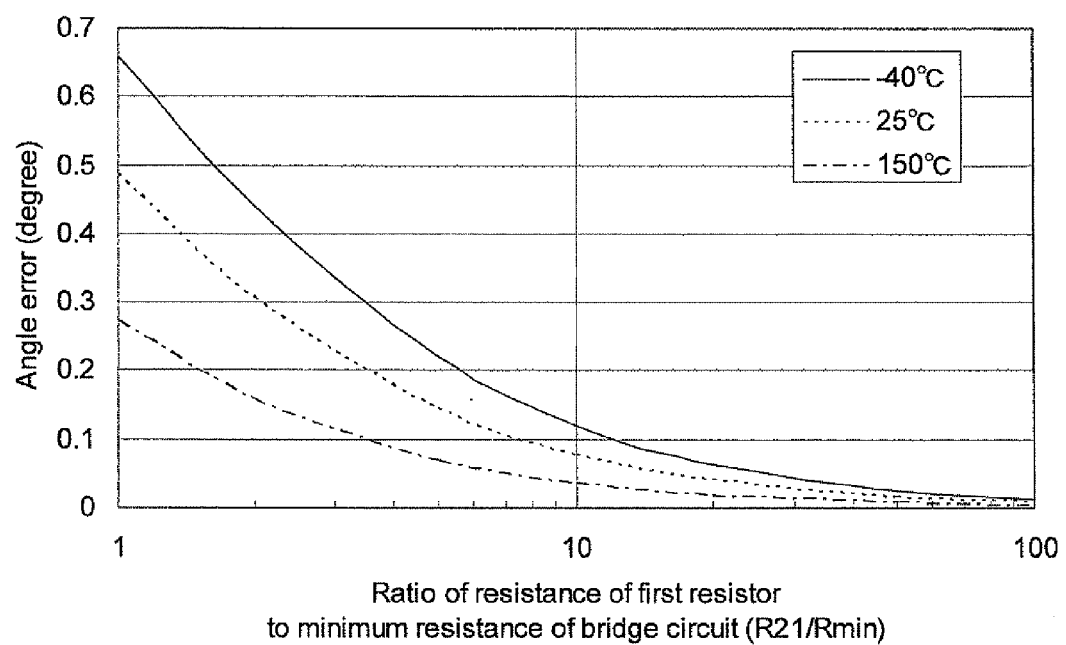
FIG. 2 is a graph in which an angle error is plotted against the ratio of the resistance of a first resistor to the minimum resistance of a bridge circuit.
Figure 3:
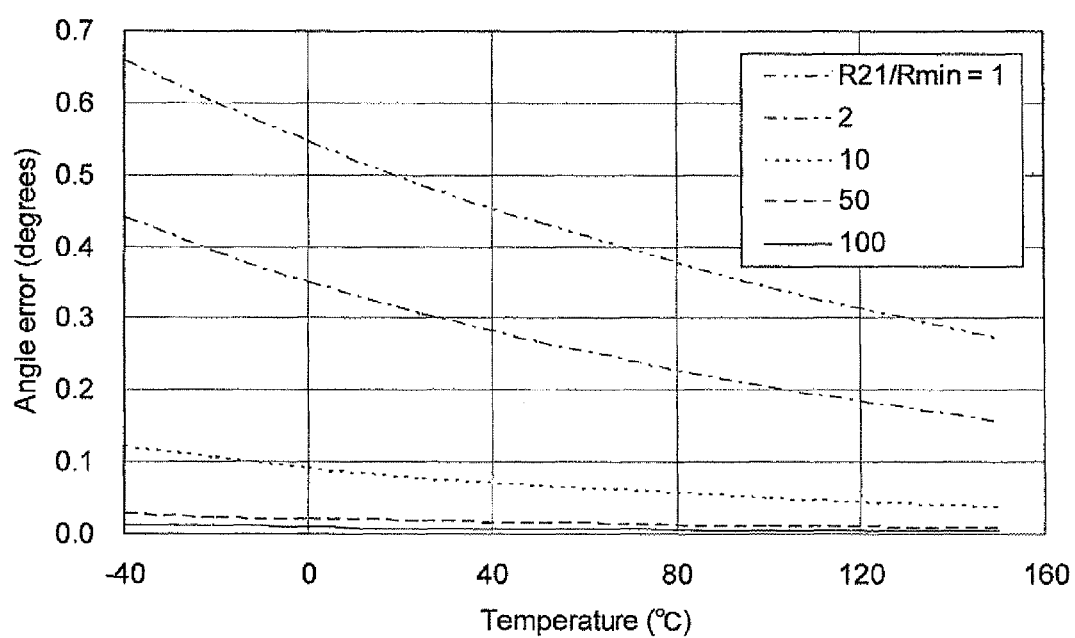
FIG. 3 is a graph showing the temperature dependence of the angle error.

FIG. 2 is a graph in which calculation results for the above-described angle error at typical temperatures are plotted against the ratio of the resistance of the first resistor (R21) to the minimum resistance of the bridge circuit ($R_{min}$). Furthermore, FIG. 3 shows calculation results of the temperature dependence of the above-described angle error obtained when the ratio of the resistance R21/R$_{min}$ is changed. The angle error as used herein refers to the amount of deviation (degree) in the angle at which the above-described distortion of the sine wave is maximized. Furthermore, the respective temperatures shown in FIG. 2 correspond to the minimum temperature (−40° C.), the maximum temperature (150° C.), and the intermediate temperature (20° C.), which are within the guaranteed temperature range, i.e., −40~150° C., when magnetic sensor 1 of the present embodiment is used as a in-vehicle component.

Calculation conditions are as follows: TMR element is used as each of the four resistance element sections included in the bridge circuit. Each of the TMR elements is configured such that the output waveform from the bridge circuit is an ideal sine wave, i.e. such that the magnetization directions of the pinned layers of the adjacent elements are antiparallel to each other. The resistance of each of the TMR elements will be the same (and at a minimum; R11$_{min}$=R12$_{min}$=R13$_{min}$=R14$_{min}$) when, in all the TMR elements, the magnetization directions of the pinned layer and the free layer are parallel to each other. In this case, the resistance of the parallel circuit including the four TMR elements, i.e., the minimum resistance of the bridge circuit R$_{min}$ is the same as the resistance of each TMR element (for example, R$_{min}$=R11$_{min}$). Furthermore, the resistances of first and second resistors 21, 22 connected to bridge circuit 10 are also the same as each other (R21=R22). Consequently, if no shunt current flowing to the external device, i.e., if the resistance of each resistor R21, R22 is infinite, then the angle error will be zero. Additionally, supply voltage V$_{cc}$ is 5 V, and temperature coefficients for the resistance and output (MR ratio) of the TMR element are −0.098% and −0.99%, respectively. A temperature coefficient for the resistance of each resistor is 0.42%, and the MR ratio of the TMR element at room temperature is 80%.

As seen in FIGS. 2 and 3, the angle error increases with decreasing temperature. This indicates that since the resistances of the TMR element and each resistor have a negative and positive temperature coefficient, respectively, the resistance of each resistor relative to that of the TMR element (that of the bridge circuit) becomes smaller with decreasing temperature. In other words, the shunt current flowing into the external device increases with decreasing temperature, leading to the increase in angle error. On the other hand, with increasing resistance of first resistor 21 (each resistor) connected to bridge circuit 10, the angle error decreases throughout the entire temperature range. This is because the increased resistance of first resistor 21 (each resistor) suppresses the shunt current flowing into the external device.

In a normal usage situation in which, for example, the rotation angle of a steering wheel in a vehicle is measured, the angle error in the magnetic sensor is preferably at most 0.5 degrees. Several possible factors contribute to the angle error. Taking into consideration only those factors that relate to shunt current flowing into the external device during measurement of the output, the ratio of the resistance of first resistor 21 (each resistor) to the minimum resistance of bridge circuit 10 is preferably at least 2, as shown in FIG. 2.

Furthermore, Taking into consideration angle error that is caused by factors other than shunt current, e.g., variation in the magnetic properties among the MR elements that are used, the angle error caused by the shunt current is preferably at most 0.1 degree. Thus, as shown in FIG. 2, the ratio of the resistance of first resistor 21 (each resistor) to the minimum resistance of bridge circuit 10 is preferably at least 12.

Even if the upper limit of the resistance of each of resistors 21, 22 is a sufficiently large value, no practical problem will occur. Thus, the upper limit may be set to any value provided that the external device such as the OP or the VM connected to external connection terminals 31, 32 can read the output voltage from magnetic sensor 1 without any problem.

As described above, the shunt current flowing into the external device can be sufficiently reduced by setting the resistance of each of the two resistors connected to the respective output terminals of the bridge circuit, at least twice and preferably at least 12 times as large as that of the bridge circuit obtained when the resistance of each MR element is at a minimum corresponding to a change in magnetoresistance. This enables a reduction in the angle error due to the shunt current, thus providing a sufficiently accurate magnetic sensor.

In the present embodiment, the magnetic sensor with the bridge circuit including the four MR elements has been described. However, a plurality of MR elements connected together in series may be used as each of the four resistance element sections in the bridge circuit instead of one MR element. In this case, the number of MR elements in each resistance element section and the magnetization direction of the pinned layer are appropriately selected so as to keep the whole bridge circuit well balanced.

The use of the plurality of MR elements as the resistance element section enables a reduction in voltage applied to each of the MR elements and thus a reduction in the risk that MR elements will be destroyed by overcurrent. Furthermore, even if the magnetic properties vary slightly among the MR elements, the variation can be averaged, which is also effective for reducing angle error caused by the factors other than the shunt current flowing into the external device.

A description of the preferred embodiment according to the present invention was given above in detail. However, it should be appreciated that a wide variety of alterations and modifications are possible as far as they do not depart from the spirit and scope of the attached claims.

What is claimed is:

1. A magnetic sensor for detecting a direction of an external magnetic field, the magnetic sensor comprising:
a bridge circuit configured to provide an output that changes in accordance with the direction of the external magnetic field, the bridge circuit including four resistance element sections, each of which comprises at least one tunnel magnetoresistance effect element; and
two resistors connected to respective output terminals of the bridge circuit,
wherein each tunnel magnetoresistance effect element comprises a pinned layer whose magnetization direction is fixed with respect to the external magnetic field, a free layer whose magnetization direction changes in accordance with the external magnetic field, and a tunnel barrier layer sandwiched between the pinned layer and the free layer, the magnetization directions of the pinned layers of adjacent resistance element sections being antiparallel to each other, and
wherein the ratio of the resistance of each of the resistors to that of the bridge circuit is at least 12 when the resistance of each of the resistance element sections is at a minimum corresponding to a change in magnetoresistance so as to reduce an angle error in detected direction of the external magnetic field, the angle error being caused by a shunt current that occurs during detection of the direction of the external magnetic field and increasing with decreasing temperature of the at least one tunnel magnetoresistance effect element.

2. The magnetic sensor according to claim 1, wherein each resistance element section comprises a plurality of tunnel magnetoresistance effect elements connected together in series.

* * * * *